(12) United States Patent
Wang et al.

(10) Patent No.: US 9,909,037 B2
(45) Date of Patent: Mar. 6, 2018

(54) ETCHING ADHESIVE TAPE, METHOD OF MANUFACTURING THE SAME AND ETCHING METHOD

(71) Applicants: BOE Technology Group Co., Ltd., Beijing (CN); HEFEI Xinsheng Optoelectronics Technology Co., Ltd., Hefei (CN)

(72) Inventors: Jing Wang, Beijing (CN); Xiaodong Xie, Beijing (CN); Min He, Beijing (CN); Ming Zhang, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/235,490

(22) Filed: Aug. 12, 2016

(65) Prior Publication Data

US 2017/0101557 A1 Apr. 13, 2017

(30) Foreign Application Priority Data

Oct. 8, 2015 (CN) .......................... 2015 1 0647122

(51) Int. Cl.
| | | |
|---|---|---|
| *C09J 9/00* | (2006.01) | |
| *C23F 1/02* | (2006.01) | |
| *C09K 13/06* | (2006.01) | |
| *C09K 13/04* | (2006.01) | |
| *C23F 1/10* | (2006.01) | |
| *C04B 41/53* | (2006.01) | |
| *C04B 41/91* | (2006.01) | |
| *C09K 13/08* | (2006.01) | |

(Continued)

(52) U.S. Cl.
CPC .............. *C09J 9/00* (2013.01); *C04B 41/5353* (2013.01); *C04B 41/91* (2013.01); *C09J 7/02* (2013.01); *C09K 13/04* (2013.01); *C09K 13/06* (2013.01); *C09K 13/08* (2013.01); *C23F 1/02* (2013.01); *C23F 1/10* (2013.01); *G06F 3/041* (2013.01); *H05K 1/09* (2013.01); *C08K 2201/014* (2013.01); *C09J 2201/28* (2013.01); *C09J 2203/318* (2013.01); *C09J 2205/102* (2013.01)

(58) Field of Classification Search
None
See application file for complete search history.

(56) References Cited

U.S. PATENT DOCUMENTS

2013/0273745 A1* 10/2013 Shim ...................... C09K 13/06
438/754

FOREIGN PATENT DOCUMENTS

| CN | 103210058 A | | 7/2013 | |
|---|---|---|---|---|
| GB | 1302796 | * | 1/1973 | ............. C03C 15/00 |

OTHER PUBLICATIONS

May 17, 2017—(CN) First Office Action Appn 201510647122.4 with English Tran.

(Continued)

*Primary Examiner* — Jiong-Ping Lu
(74) *Attorney, Agent, or Firm* — Banner & Witcoff, Ltd.

(57) ABSTRACT

An etching adhesive tape for manufacturing a touch screen and a manufacturing method thereof, and an etching method are disclosed. The etching adhesive tape includes a base sheet and a functional layer disposed on the base sheet, the functional layer includes a first region corresponding to a region to be etched, and the first region includes an etching paste.

18 Claims, 3 Drawing Sheets

(51) Int. Cl.
*G06F 3/041* (2006.01)
*H05K 1/09* (2006.01)
*C09J 7/02* (2006.01)

(56) References Cited

OTHER PUBLICATIONS

Nov. 15, 2017—(CN) Second Office Action Appn 201510647122.4 with English Tran.

\* cited by examiner

ETCHING ADHESIVE TAPE, METHOD OF MANUFACTURING THE SAME AND ETCHING METHOD

This application claims priority to and the benefit of Chinese Patent Application No. 201510647122.4 filed on Oct. 8, 2015, which application is incorporated herein in its entirety.

TECHNICAL FIELD

Embodiments of the present disclosure relate to an etching adhesive tape and a manufacturing method thereof, and an etching method.

BACKGROUND

As a special kind of computer peripheral equipment, touch screens are the simplest and most convenient human-computer interaction means until now, and extensively used in the portable electronic devices. At present, the major manufacturers adopt a process of depositing a whole layer of silicon oxide or silicon oxynitride layer on an ITO (Tin Oxide Indium) layer in the production of a touch screen, so as to realize the effect of shadow elimination, insulation, and protection. Before bonding a flexible printed circuit (FPC) to the touch screen, the silicon oxynitride layer for example corresponding to the bonding region, in which the FPC is bonded (i.e. bonding region), should be removed first. However, the major manufacturers currently adopt the following insulation layer remove method: after evenly stirring an etching paste, coating the etching paste to the region of interest on the touch screen through a screen printing method, then after a predetermined time period, spraying water to the region to clean the touch screen, whereby the silicon oxynitride layer in the region can be removed along with the water cleaning. However, this method wastes a lot of etching paste in the process, and needs consumptive materials such as screen printing plate, and therefore, the production cost is increased and the operation ratio of the production line is decreased.

SUMMARY

An embodiment of the present disclosure provides an etching adhesive tape, which comprises a base sheet and a functional layer disposed on the base sheet, the functional layer comprises a first region corresponding to a region to be etched, and the first region comprises an etching paste.

Another embodiment of the present disclosure further provides a method of manufacturing an etching adhesive tape, comprising: applying a material including an etching paste on a first region, which is corresponding to a region to be etched, of a base sheet; a second region outside the first region is maintained blank or coated with an adhesive material.

Further another embodiment of the present disclosure further provides an etching method, comprising attaching the above-mentioned etching adhesive tape on a region to be etched of a substrate to be etched.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
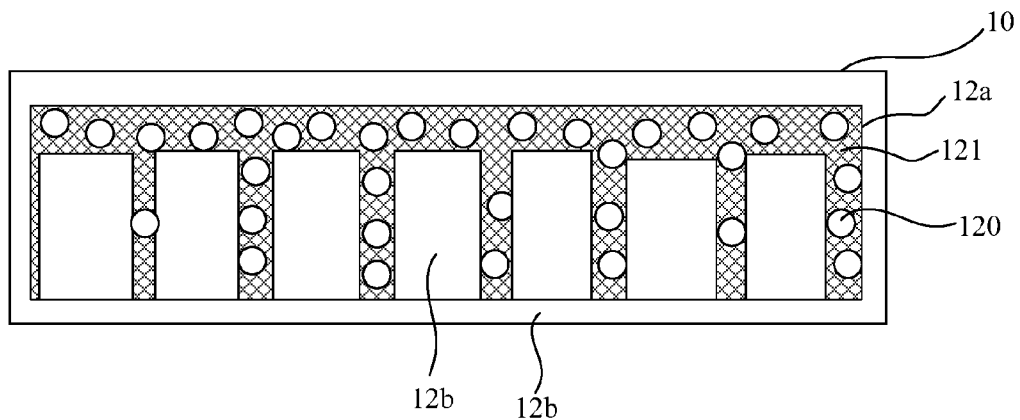
FIG. 1 is a plan view of an etching adhesive tape provided by an embodiment of the present disclosure.
Figure 2:
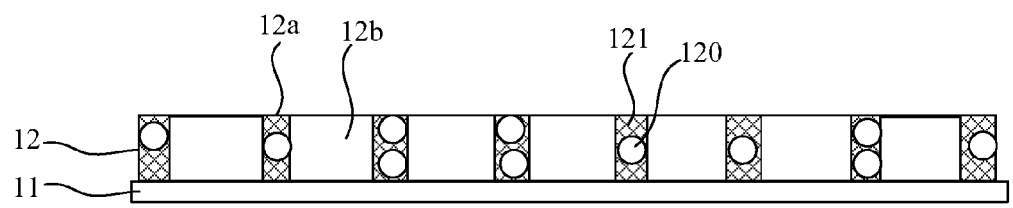
FIG. 2 is a cross-sectional view of an etching adhesive tape provided by an embodiment of the present disclosure.

An embodiment of the present disclosure provides an etching adhesive tape for example for manufacturing a touch screen; as illustrated in FIG. 1 and FIG. 2, the etching adhesive tape 10 comprising: a base sheet 11 and a functional layer 12 disposed on the base sheet 11. The functional layer 12 comprises a first region 12a, which is corresponding to a region to be etched, and the first region 12a is formed with a material including an etching paste.

The present embodiment provides an etching adhesive tape for example for manufacturing a touch screen, and the adhesive tape 10 comprises a base sheet 11 and a functional layer 12 disposed on the base sheet 11; a first region 12a, which has the same pattern as a region to be etched, is provided in the functional layer 12, and the first region 12a is formed through coating a material including an etching paste 102 for example. When used in the etching process, the adhesive tape 10 is attached on the film to be etched; correspondingly the first region 12a is attached to the film to be etched in the region to be etched. The film to be etched in the region to be etched is removed under the etching effect of the etching paste 120. The above-mentioned first region 12a should have the etching effect, i.e., the forming material should comprise the etching paste 120, meanwhile, the forming material may further comprise other material that contributes to attaching or etching, and the present embodiment will not be limited to the other material.

For example, the above-mentioned first region 12a can have both the etching effect and the adhesion effect, i.e., the forming material of the above-mentioned first region 12a comprises both an etching paste 120 for providing the etching effect and an adhesive material 121 for providing the adhesion effect; in this way, the etching effect can be improved also.

For example, the above-mentioned adhesive tape can further comprise other region(s) outside the first region 12a, such as a second region 12b, the other region can be maintained blank, i.e., no material is applied therein, or the other region is coated with an adhesive material or other filling material without the etching effect and the adhesion effect.

As illustrated in FIG. 1, the first region 12a and the second region 12b are complementary to each other in shape, forming an interdigitate configuration. Further, the first region 12a comprise a plurality of elongated portions that are disposed side by side; the second region 12b comprise a plurality of elongated portions that are disposed side by side, and the second region 12b is in the shape of comb as a whole. The elongated portions of the first region 12a and the elongated portions of the second region 12b are disposed alternately. The elongated portions of the first region 12a correspond to the pins or pads in a PAD region for example in arrangement.

Figure 3:
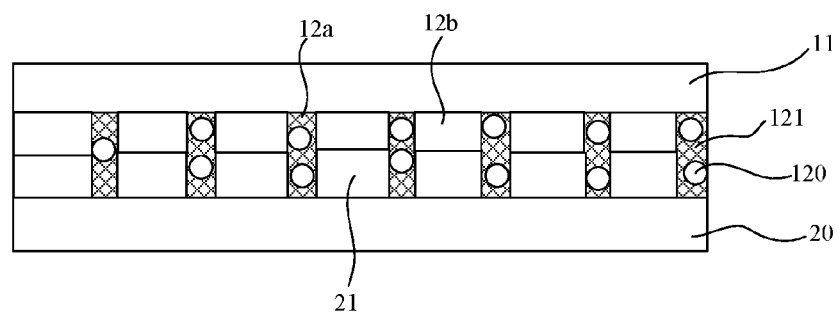
FIG. 3 is a schematic diagram of etching a bonding region of a substrate with the etching adhesive tape provided by an embodiment of the present disclosure.

FIG. 1 and FIG. 2 illustrate an etching adhesive tape in accordance with the present embodiment. FIG. 3 illustrates a schematic diagram of etching a bonding region with the etching adhesive tape being attached to the surface of a substrate 20 to be etched (such as touch screen in production). The first region 12a of the adhesive tape has both the etching effect and the adhesion effect, and is shaped corresponding to a region to be etched of the substrate 20; for example, the second region 12b is maintained blank and coated without any material, and is shaped corresponding to a pad region 21.

The etching adhesive tape provided by the present embodiment has the following advantages such as high etching accuracy, low consumption of etching paste, and less consumption of consumptive material such as screen printing plate, and fathomer, the manufacturing cost is greatly reduced, the product manufacturing cycle is shortened, lot of manpower is avoided, and the product yield is increased while the production cost is reduced.

Figure 4:
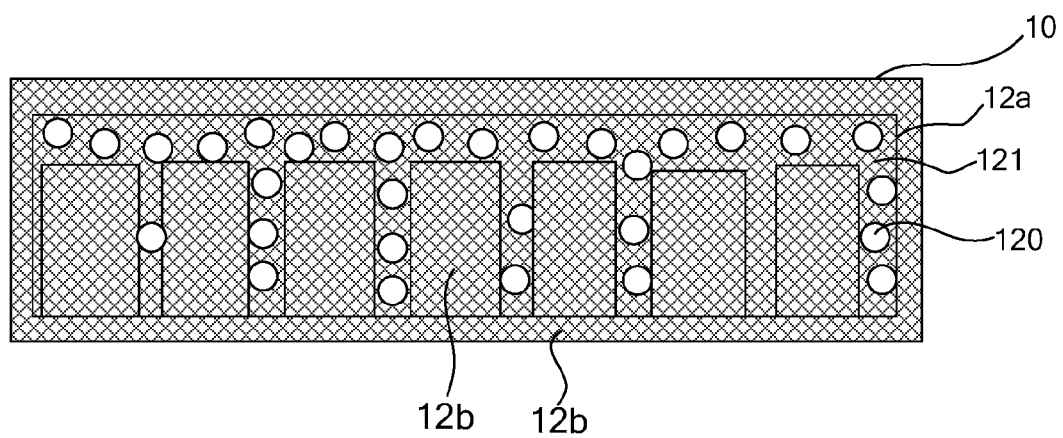
FIG. 4 is a plan view of a second etching adhesive tape provided by an embodiment of the present disclosure.
Figure 5:
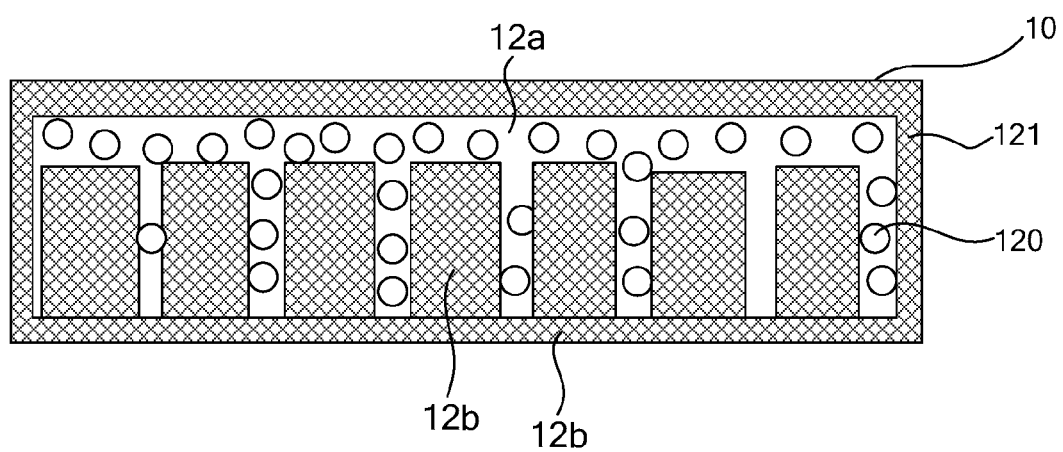
FIG. 5 is a plan view of a third etching adhesive tape provided by an embodiment of the present disclosure.

It should be understood that FIG. 1 and FIG. 2 are only an embodiment in accordance with the present embodiment, there may exist other embodiments. As illustrated in FIG. 4, the forming material of the first region 12a of the adhesive tape 10 comprises the etching paste 120 and the adhesive material 121; the second region 12b is formed through coating an adhesive material therein, i.e., both the first region 12a and the second region 12b have the adhesion effect, but only the first region 12a has the etching effect; or, as illustrated in FIG. 5, the forming material of the first region 12a comprises the etching paste 120 but no the adhesive material; the second region 12b is formed through coating an adhesive material; i.e., the first region 12a has the etching effect only, and the second region 12b has the adhesion effect only.

An embodiment of the present disclosure further provides a method of manufacturing an etching adhesive tape for manufacturing the touch screen, and the method comprises the following operations. A material including an etching paste is applied (e.g., coated) onto a first region 12a, which is corresponding to a region to be etched, of a base sheet 11; a second region 12b outside the first region 12a is maintained blank or coated with an adhesive material. The present embodiment provides a method of manufacturing an etching adhesive tape, which can be manufactured with an existing coating equipment, the method is simple, and the manufacturing cost is low.

An embodiment of the present disclosure further provides an etching method. Any above-mentioned adhesive tape is aligned with the region to be etched and is attached to the region to be etched, so that the first region 12a of the adhesive tape is corresponding to the region to be etched; the adhesive tape is torn off the region after a predetermined time period which allows the etching paste to react with the material of the film to be etched so as to remove the material as required; the region to be etched is cleaned with water or in other methods, after the adhesive tape is torn out, to remove the reaction production and residual etching paste. The etching method use the adhesive tape provided by the embodiment of the present disclosure; therefore, the etching method has high etching accuracy and low consumption of etching paste, does not suffer from over-etching, is easy to operate, and has a simple process.

In the following, the technical solutions provided by an embodiment of the present disclosure will be described in detail with reference to an example.

As illustrated in FIG. 2, the present embodiment provides an etching adhesive tape for etching the silicon oxynitride film on the bonding region of a touch display device in an example, the first region 12a of the adhesive tape is in accordance with the region to be etched of the bonding region; e.g., the first region 12a and the region to be etched have the same pattern and size. For the etching adhesive tape, the second region 12b outside the first region 12a is coated with an adhesive material or maintained blank. In the operation, the silicon oxynitride film in the whole bonding region can be removed by reaction between the silicon oxynitride and the etching paste, or only the silicon oxynitride film corresponding to the region to be etched, which region needs to electrically connect to an electrode or electrodes of an FPC, is removed by reaction; therefore the pattern and size of the first region 12a is accordingly determined.

Figure 6:
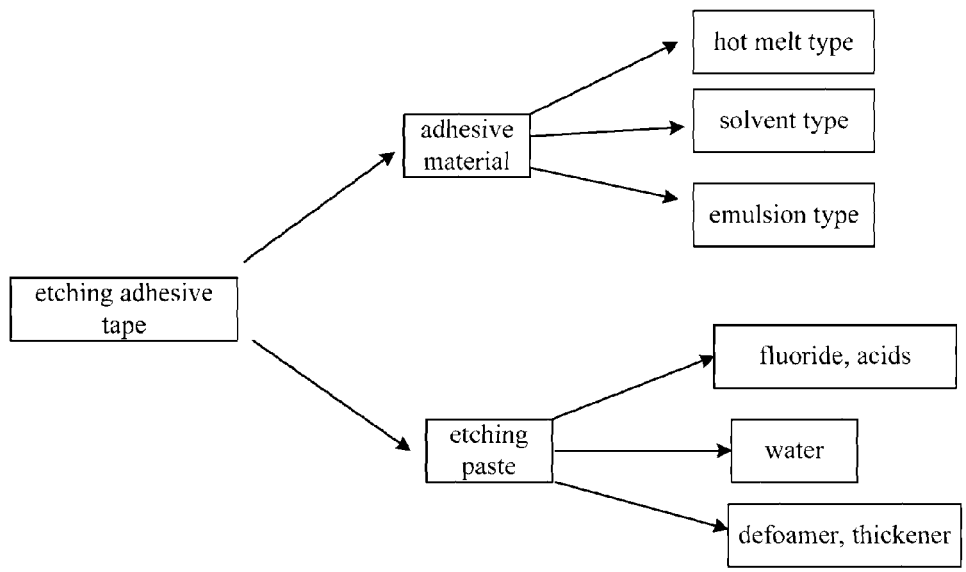
FIG. 6 is a schematic diagram of ingredients list of an etching adhesive tape provided by an embodiment of the present disclosure.

As illustrated in FIG. 6, the forming material of the first region 12a comprises an etching paste and an adhesive material. The composition of the etching paste can be selected according to the target material to be etched. For example, for silicon oxynitride ($SiN_xO_y$) material, the etching paste may comprises defoamer, thickener, water, acids (e.g., aormic acid, sulfuric acid, phosphoric acid, or the like), fluoride (e.g., ammonium fluoride, sodium fluoride, or the like), and so on; the above-mentioned etching paste can formed into a solid state paste rather than a liquid state paste, and the adhesive material can be hot melt type, solvent type, emulsion type, or the like, the embodiment of the present disclosure will be not limited thereto. In an example, the adhesive material is a resin adhesive. The etching paste and the adhesive material can be mixed into a composite paste (paste mixture) and the composite paste is coated on the first region 12a, for example, the composite paste can be coated with a mask.

Figure 7:
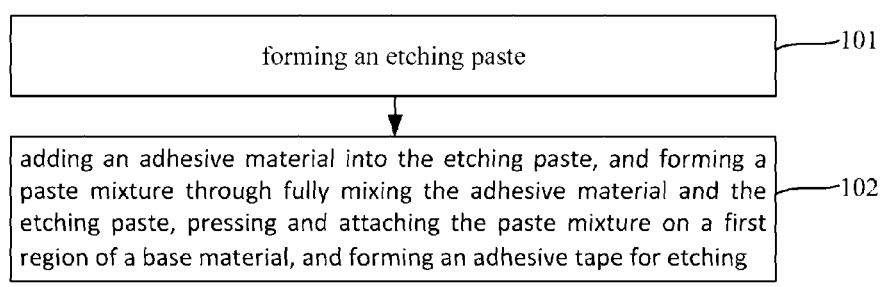
FIG. 7 is a flow chart of a method of manufacturing an etching adhesive tape provided by an embodiment of the present disclosure.

As illustrated in FIG. 7, the adhesive tape for etching can be formed through the following operation in an example.

Step 101, forming an etching paste. For example, this step can comprise mixing defoamer, thickener, water, acids (e.g., aormic acid, sulfuric acid, phosphoric acid, or the like) and fluoride (e.g., ammonium fluoride, sodium fluoride, or the like), stirring evenly the mixture at room temperature to obtain a solid state paste.

Step 102, adding an adhesive material into the etching paste, and forming a paste mixture through fully mixing the adhesive material and the etching paste, applying (e.g., pressing and attaching) the paste mixture onto a first region 12a of a base sheet 11, whereby an etching adhesive tape can be obtained. During the pressing and attaching process, the process parameters can be selected according to the following table 1. Furthermore, a second region 12b outside the first region 12a is maintained blank or coated with an adhesive material.

TABLE 1

| Attaching etching paste onto the adhesive tape | Attaching length | Relating to the length, width, and position of a bonding region |
|---|---|---|
| | Time | Relating to the takt time and the desired etching level |
| | Lift-off speed | Moderate |
| | Pressure | Ensuring no bubble, and no residual etching paste when lift-offing the base sheet |

Plural types of etching paste adhesive tape with different sizes can be prepared in advance according to the sizes of the bonding regions and the patterns to be formed (or the regions to be etched). In the manufacturing process, an adhesive tape for etching can be applied to the bonding region in an aligned attachment process with the help of an alignment mark formed in the bonding region, the adhesive tape is torn off the bonding region after a predetermined time period; the region to be etched is cleaned, after the adhesive tape is tore off, with pure water to remove the etching production and residual etching paste. The predetermined time period is determined by the desired etching effects, and can be determined through experiment, generally 5-10 minutes.

An embodiment of the present disclosure provides an etching adhesive tape and a manufacturing method thereof, and an etching method. In an example of the embodiment, a resin adhesive is added into an etching paste, after the above-mentioned two materials have been mixed evenly, the mixture can be coated onto a base sheet according to the predetermined pattern so as to form an adhesive tape. The resultant adhesive tape can be used for example in etching a predetermined region of the substrate in the manufacturing process. The etching method can reduce the consumption of etching paste while improve etching accuracy, reduce the consumption of consumptive material such as screen printing plate, and may further realize automatic operation during the etching process, avoid the manual cleaning step, which greatly reduces the manufacturing cost, shorten the product manufacturing cycle, and improve the product yield. Furthermore, when etching the bonding region of a touch screen with the etching method of an embodiment of the disclosure, the ITO layer is not damaged, the cleaning operation is easy and without the need of using an organic detergent, the concentration of the organics and fluoride in the waste water after cleaning is low. The etching paste adhesive tape of an embodiment of the disclosure is easy to use, safe and reliable; the usage of the etching paste adhesive tape can reduce the manufacturing process and the costs, contribute to maintaining a clean workplace and fresh air, and provide a more friendly working environment.

It is apparent that the shape and the forming material illustrated in the accompanying drawing is only one feasible example, and should not recognized as an limitation upon the present disclosure, it can be set according to the reality in implementation.

What are described above is related to the illustrative embodiments of the disclosure only and not limitative to the scope of the disclosure; the scopes of the disclosure are defined by the accompanying claims.

The application claims priority to the Chinese patent application No. 201510647122.4, filed Oct. 8, 2015, the entire disclosure of which is incorporated herein by reference as part of the present application.

What is claimed is:

1. An etching adhesive tape, comprising: a base sheet and a functional layer disposed on the base sheet,
   wherein the functional layer comprises a first region corresponding to a region to be etched, and the first region comprises an etching paste,
   wherein the functional layer further comprises a second region outside the first region, and the second region consists of an adhesive material.

2. The etching adhesive tape according to claim 1, wherein the first region further comprises the adhesive material.

3. The etching adhesive tape according to claim 2, wherein the etching paste comprises a solid state paste made from a mixture of defoamer, thickener, water, acids and fluoride.

4. The etching adhesive tape according to claim 1, wherein the etching paste comprises a solid state paste made from a mixture of defoamer, thickener, water, acids and fluoride.

5. The etching adhesive tape according to claim 1, wherein the adhesive material is a resin adhesive.

6. The etching adhesive tape according to claim 1, wherein the first region comprises a plurality of elongated portions that are disposed side by side, the second region comprises a plurality of elongated portions that are disposed side by side, and the elongated portions of the first region and the elongated portions of the second region are disposed alternately.

7. The etching adhesive tape according to claim 6, wherein the second region is in a shape of comb as a whole.

8. A method of manufacturing the etching adhesive tape according to the claim 1, comprising:
   applying a material including the etching paste onto the first region,
   wherein the second region outside the first region is applied with the adhesive material.

9. The method according to the claim 8, further comprising forming the etching paste.

10. The method according to the claim 9, wherein forming the etching paste comprises:
    mixing defoamer, thickener, water, acids and fluoride to obtain a mixture; and
    adding the adhesive material into the mixture so as to obtain a paste mixture.

11. The method according to the claim 8, wherein the etching paste is applied onto the first region, forming the etching adhesive tape.

12. The method according to the claim 11, wherein the etching paste is pressed and attached onto the first region.

13. An etching method, comprising attaching the etching adhesive tape according to the claim 1 onto a region to be etched of a substrate to be etched.

14. The etching method according to the claim 13, wherein an alignment process is carried out to allow the first region of the etching adhesive tape to be attached onto the region to be etched.

15. The etching method according to the claim 13, further comprising:
    tearing off the etching adhesive tape after a predetermined time period; and
    cleaning the region to be etched after the etching adhesive tape is torn off.

16. The etching method according to the claim 13, further comprising cleaning the region to be etched with pure water.

17. The etching method according to the claim 13, wherein, the substrate to be etched is a touch screen, and the region to be etched is a bonding region.

18. The etching method according to the claim 17, wherein, a silicon oxynitride film on the bonding region is etched by the etching adhesive tape.

\* \* \* \* \*